United States Patent
Chen et al.

(10) Patent No.: US 10,776,550 B1
(45) Date of Patent: Sep. 15, 2020

(54) INTEGRATED CIRCUIT HAVING TIMING FIXING CIRCUIT THAT INTRODUCES NO SHORT-CIRCUIT CURRENT UNDER NORMAL OPERATION AND ASSOCIATED TIMING FIXING CELL IN CELL LIBRARY

(71) Applicant: MEDIATEK INC., Hsin-Chu (TW)

(72) Inventors: Yi-Feng Chen, Hsin-Chu (TW); Chun-Sung Su, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/383,650

(22) Filed: Apr. 14, 2019

(51) Int. Cl.
  *H03K 5/13* (2014.01)
  *G06F 30/39* (2020.01)

(52) U.S. Cl.
  CPC .............. *G06F 30/39* (2020.01); *H03K 5/13* (2013.01)

(58) Field of Classification Search
  CPC ................................. G06F 30/39; H03K 5/13
  USPC ........................................................ 327/288
  See application file for complete search history.

(56) References Cited

U.S. PATENT DOCUMENTS

| | | | | |
|---|---|---|---|---|
| 5,130,564 A * | 7/1992 | Sin | ......................... | H03K 5/133 327/264 |
| 5,459,424 A * | 10/1995 | Hattori | .................. | H03K 5/133 327/278 |
| 6,121,813 A * | 9/2000 | Furuchi | ..................... | H03K 5/13 327/285 |
| 6,141,265 A * | 10/2000 | Jeon | ..................... | G11C 7/1072 365/194 |
| 6,204,705 B1 * | 3/2001 | Lin | ...................... | H03L 7/0812 327/158 |
| 7,042,266 B2 * | 5/2006 | Takahashi | .............. | H03K 5/133 327/284 |
| 8,044,696 B2 * | 10/2011 | Kim | ..................... | H03K 5/133 327/261 |
| 8,203,371 B2 * | 6/2012 | Jeon | ...................... | H03H 11/26 327/261 |
| 2010/0109735 A1 * | 5/2010 | Lee | .......................... | G11C 7/08 327/288 |

* cited by examiner

*Primary Examiner* — Ryan Jager
(74) *Attorney, Agent, or Firm* — Winston Hsu

(57) ABSTRACT

An integrated circuit includes a path logic and a timing fixing circuit. The path logic is coupled between an output pin of a first circuit and an input pin of a second circuit. The timing fixing circuit has an input pin coupled to the path logic, and is used to adjust a propagation delay of the path logic. The timing fixing circuit introduces no short-circuit current under normal operation.

10 Claims, 13 Drawing Sheets

INTEGRATED CIRCUIT HAVING TIMING FIXING CIRCUIT THAT INTRODUCES NO SHORT-CIRCUIT CURRENT UNDER NORMAL OPERATION AND ASSOCIATED TIMING FIXING CELL IN CELL LIBRARY

BACKGROUND

The disclosed embodiments of the present invention relate to an integrated circuit design, and more particularly, to an integrated circuit having a timing fixing circuit that introduces no short-circuit current under normal operation and an associated timing fixing cell in a cell library.

Setup and hold time checks are the most common types of timing checks used in timing verification of an integrated circuit layout design. For example, synchronous inputs have setup and hold time specification with respect to the clock input. These checks specify that the data input must remain stable for a specified time period just before and just after the clock edge. The time period just before the clock edge is called setup time. The time period just after the clock edge is called hold time. When timing verification of an integrated circuit layout design indicates timing violation (e.g., setup time violation and/or hold time violation), the integrated circuit layout design needs proper modification to meet the timing requirement (e.g., setup time requirement and/or hold time requirement).

SUMMARY

In accordance with exemplary embodiments of the present invention, an integrated circuit having a timing fixing circuit that introduces no short-circuit current under normal operation and an associated timing fixing cell in a cell library are proposed.

According to a first aspect of the present invention, an exemplary integrated circuit is disclosed. The exemplary integrated circuit includes a path logic and a timing fixing circuit. The path logic is coupled between an output pin of a first circuit and an input pin of a second circuit. The timing fixing circuit has an input pin coupled to the path logic, and is arranged to adjust a propagation delay of the path logic, wherein the timing fixing circuit introduces no short-circuit current under normal operation.

According to a second aspect of the present invention, an exemplary non-transitory storage device that stores a program code is disclosed. When loaded and executed by a processor, the program code instructs the processor to perform following steps: utilizing a cell library that comprises a first timing fixing cell and a second timing fixing cell, wherein the first timing fixing cell is a representation of a first timing fixing circuit that introduces short-circuit current under normal operation, and the second timing fixing cell is a representation of a second timing fixing circuit that introduces no short-circuit current under normal operation; and executing a cell swapping command to replace at least one first timing fixing cell in an integrated circuit layout design with at least one second timing fixing cell.

According to a third aspect of the present invention, an exemplary non-transitory storage device that stores a program code and a cell library is disclosed. When loaded and executed by a processor, the program code instructs the processor to perform following steps: selecting a timing fixing cell from the cell library, wherein the timing fixing cell is a representation of a timing fixing circuit that introduces no short-circuit current under normal operation; and adding the timing fixing cell to an integrated circuit layout design.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to.". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
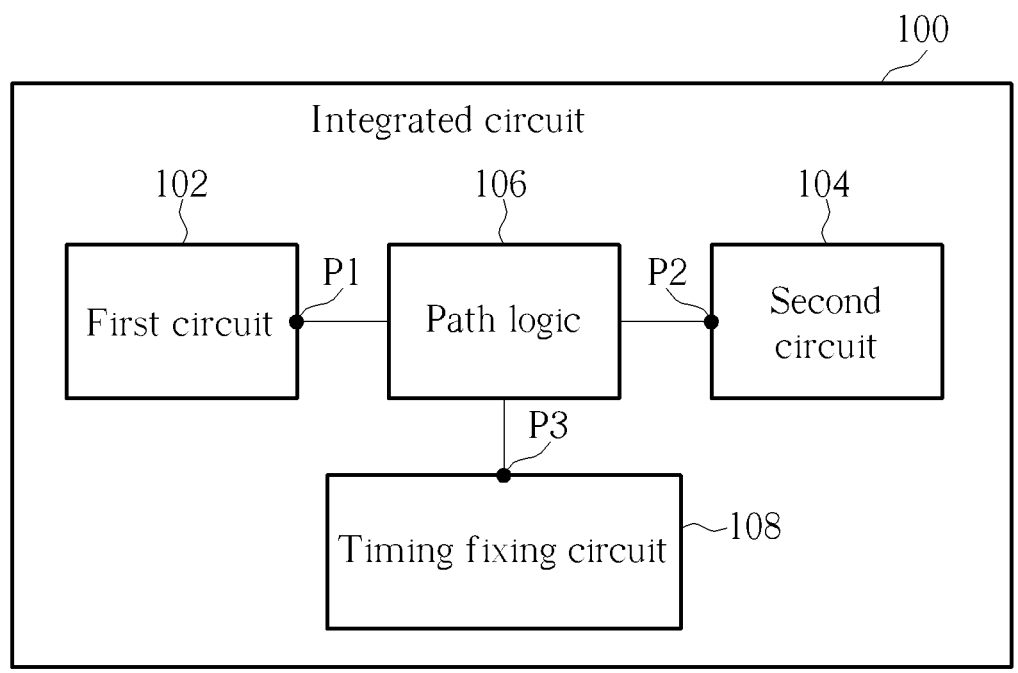
FIG. 1 is a diagram illustrating an integrated circuit according to an embodiment of the present invention.

FIG. 1 is a diagram illustrating an integrated circuit according to an embodiment of the present invention. For clarity and simplicity, only the components pertinent to the present invention are illustrated in FIG. 1. As shown in FIG. 1, the integrated circuit 100 includes a first circuit 102, a second circuit 104, a path logic 106, and a timing fixing circuit 108. The path logic 106 is coupled between an output pin P1 of the first circuit 102 and an input pin P2 of the second circuit 104. The path logic 106 is arranged to pass an output signal (or output data) of the first circuit 102 to the second circuit 104, and may include one or more buffers cascaded between the output pin P1 of the first circuit 102 and the input pin P2 of the second circuit 104. Thus, the path logic 106 provides a propagation delay to the output signal (or output data) of the first circuit 102 due to buffer (s) located at the signal path (or data path). The timing fixing circuit 108 has an input pin P3 coupled to the path logic 106, and is arranged to adjust the propagation delay of the path logic 106.

Figure 2:
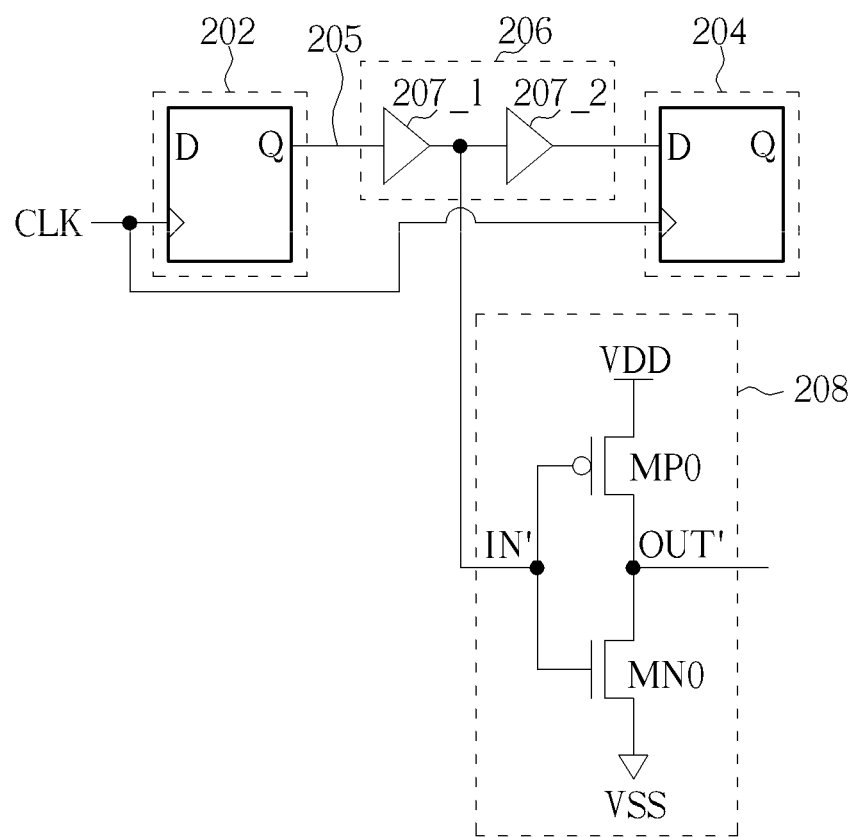
FIG. 2 is a diagram illustrating a timing fixing circuit that introduces short-circuit current under normal operation according to an embodiment of the present invention.

FIG. 2 is a diagram illustrating a timing fixing circuit that introduces short-circuit current under normal operation according to an embodiment of the present invention. In this example, the first circuit 102 shown in FIG. 1 may be implemented by a D-type flip-flip (DFF) 202 that is triggered by edges of a clock signal CLK and has a data input pin (denoted by "D"), a data output pin (denoted by "Q"), and a clock input pin (denoted by ">"); the second circuit 104 shown in FIG. 1 may be implemented by a DFF 204 that is triggered by edges of the clock signal CLK and has a data input pin (denoted by "D"), a data output pin (denoted by "Q"), and a clock input pin (denoted by ">"); the path logic 106 shown in FIG. 1 may be implemented by buffers 207_1 and 207_2 located at a data path 205; and the timing fixing circuit 108 shown in FIG. 1 may be implemented by an inverter 208 having an input pin IN' and an output pin OUT'. Since the input pin IN' of the inverter 208 is coupled to the data path 205, the capacitive load of the data path 205 is increased by the added timing fixing circuit (i.e., inverter 208), thus resulting in an increased propagation delay of the data path 205. For example, the timing fixing circuit (i.e., inverter 208) can be added to increase a propagation delay of the data path 205 for fixing the hold time violation.

As shown in FIG. 2, the inverter 208 includes a P-channel metal oxide semiconductor field-effect transistor (PMOS transistor) MP0 and an N-channel metal oxide semiconductor field-effect transistor (NMOS transistor) MN0. Regarding the PMOS transistor MP0, a control terminal (e.g., gate) is coupled to the input pin IN' of the inverter 208, a first connection terminal (e.g., source) is coupled to a power rail VDD, and a second connection terminal (e.g., drain) is coupled to the output pin OUT' of the inverter 208. Regarding the NMOS transistor MN0, a control terminal (e.g., gate) is coupled to the input pin IN' of the inverter 208, a first connection terminal (e.g., source) is coupled to a power rail VSS, and a second connection terminal (e.g., drain) is coupled to the output pin OUT' of the inverter 208. The power rail VDD is used to deliver a supply voltage (e.g., 3.3V or 5V), and the other power rail VSS is used to deliver a ground voltage (e.g., 0V).

Figure 3:
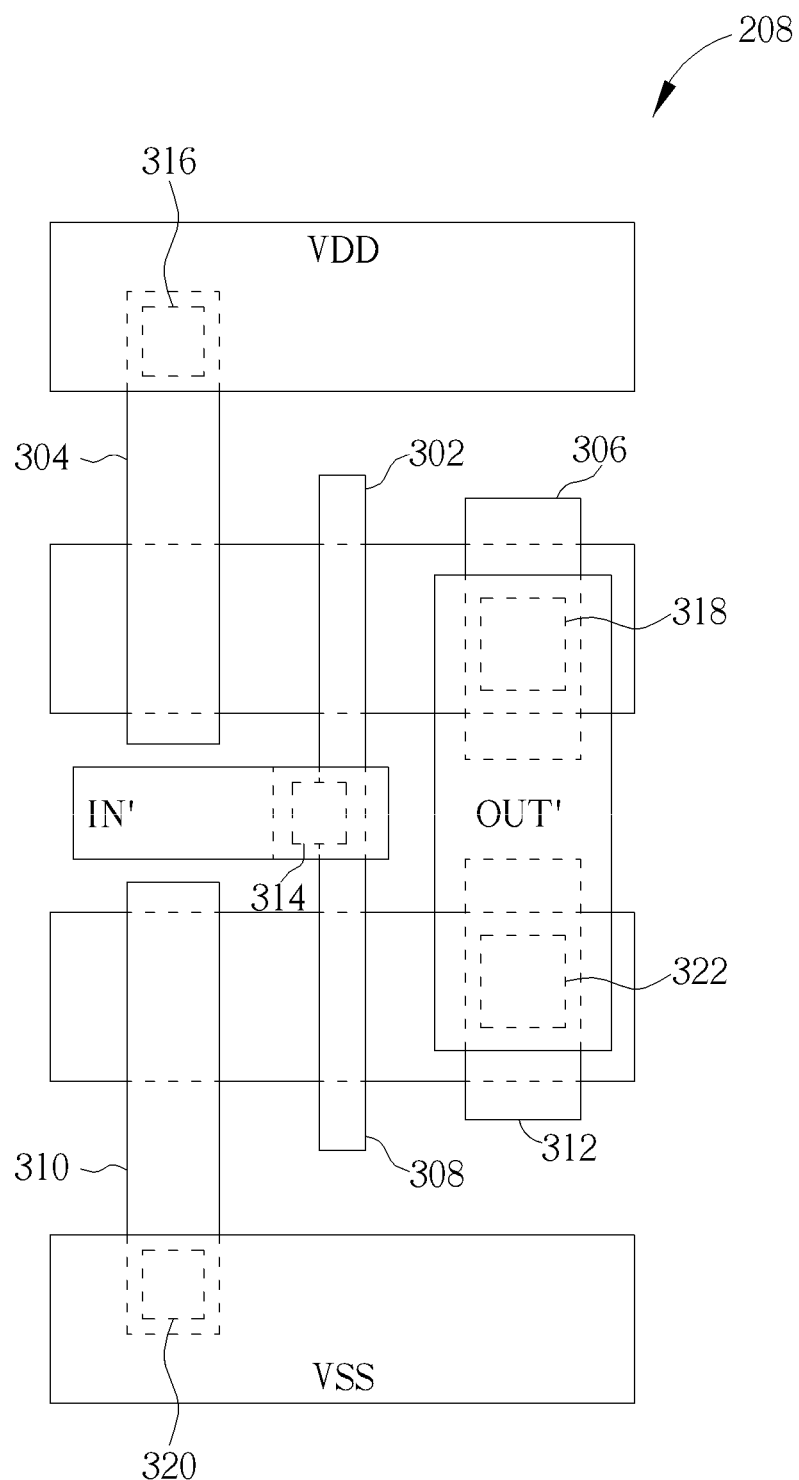
FIG. 3 is a diagram illustrating an exemplary layout of an inverter shown in FIG. 2.

FIG. 3 is a diagram illustrating an exemplary layout of the inverter 208 shown in FIG. 2. The input pin IN', the output pin OUT' and the power rails VDD and VSS are on a metal layer. The source 304 and drain 306 of the PMOS transistor MP0 and the source 310 and drain 312 of the NMOS transistor MN0 are on a metal diffusion (MD) layer. Regarding the PMOS transistor MP0, the poly gate 302 is connected to the input pin IN' at via 314, the source 304 is connected to the power rail VDD at via 316, and the drain 306 is connected to the output pin OUT' at via 318. Regarding the NMOS transistor MN0, the poly gate 308 is connected to the input pin IN' at via 314, the source 310 is connected to the power rail VSS at via 320, and the drain 312 is connected to the output pin OUT' at via 322.

Due to inherent characteristics of the inverter 208, both of PMOS transistor MP0 and NMOS transistor MN0 are turned under a condition that a voltage level at the input pin IN' of the inverter 208 is within a specific voltage range, thus leading to short-circuit current flowing from the power rail VDD to the power rail VSS. As a result, an integrated circuit with timing fixing circuits implemented using inverters suffers from an IR-drop issue. To address this issue, the present invention proposes an innovative timing fixing circuit that introduces no short-circuit current under normal operation.

Figure 4:
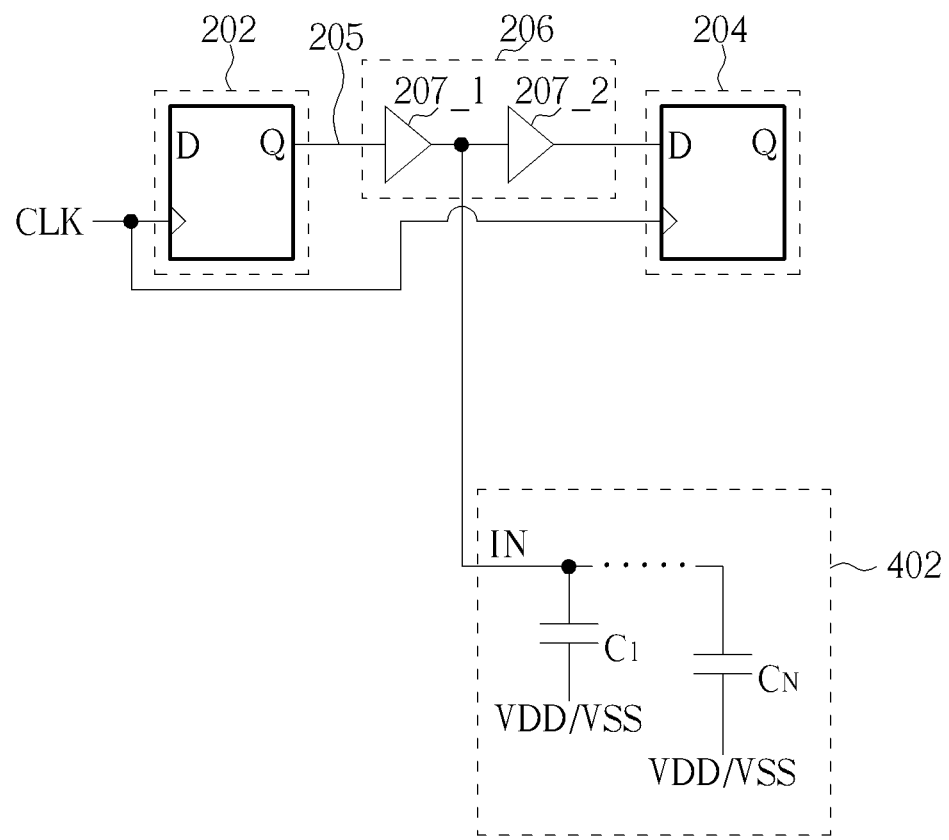
FIG. 4 is a diagram illustrating a timing fixing circuit that introduces no short-circuit current under normal operation according to an embodiment of the present invention.

FIG. 4 is a diagram illustrating a timing fixing circuit that introduces no short-circuit current under normal operation according to an embodiment of the present invention. In this example, the first circuit 102 and the second circuit 104 shown in FIG. 1 may be implemented by DFFs 202 and 204; the path logic 106 shown in FIG. 1 may be implemented by buffers 207_1 and 207_2 located at the data path 205; and the timing fixing circuit 108 shown in FIG. 1 may be implemented by a timing fixing circuit 402 that has an input pin IN but no output pin. Since the input pin IN of the timing fixing circuit 402 is coupled to the data path 205, the capacitive load of the data path 205 is increased by an added timing fixing circuit (i.e., timing fixing circuit 402), thus resulting in an increased propagation delay of the data path 205. For example, the timing fixing circuit 402 can be added to increase a propagation delay of the data path 205 for fixing the hold time violation.

As shown in FIG. 4, the timing fixing circuit 402 has one or more capacitors $C_1$-$C_N$ each having a first plate and a second plate, where N≥1. In one exemplary design, the timing fixing circuit 402 may be configured to have two capacitors $C_1$ and $C_N$, where N=2. In another exemplary design, the timing fixing circuit 402 may be configured to have more than two capacitors $C_1$-$C_N$, where N>2. The number of capacitors that are coupled to the input pin IN depends upon the design considerations. In one exemplary design, all of the capacitors $C_1$-$C_N$ are coupled to the input pin IN for making the timing fixing circuit 402 have a largest capacitance value. In another exemplary design, some of the capacitors $C_1$-$C_N$ are coupled to the input pin IN, and the remaining of the capacitors $C_1$-$C_N$ are isolated from the input pin IN.

The power rail VDD is used to deliver a supply voltage (e.g., 3.3V), and the other power rail VSS is used to deliver a ground voltage (e.g., 0V). The input pin IN of the timing fixing circuit 402 is coupled to the first plate of at least one of the capacitors $C_1$-$C_N$. For example, the input pin IN of the timing fixing circuit 402 is coupled to the first plate of only one capacitor (e.g., $C_1$) such that a minimum capacitance value is possessed by the timing fixing circuit 402. For another example, the input pin IN of the timing fixing circuit 402 is coupled to first plates of all capacitors $C_1$-$C_N$ such that a maximum capacitance value is possessed by the timing fixing circuit 402. Considering a case where N=2, the first plate of the capacitor $C_1$ and the first plate of the capacitor $C_N$ (N=2) may be coupled to the input pin IN of the timing fixing circuit 402, the second plate of the capacitor $C_1$ may be coupled to the power rail VDD, and the second plate of the capacitor $C_N$ (N=2) may be coupled to the power rail VSS. To put it simply, the capacitance value of the timing fixing circuit 402 employed in an integrated circuit can be scalable.

For a capacitor coupled between the input pin IN and one power rail VDD/VSS, there is no short-circuit current flowing from the power rail VDD to the power rail VSS through the capacitor, regardless of a voltage level at the input pin IN of the timing fixing circuit 402. In this way, an integrated circuit benefits from the proposed timing fixing circuit that is IR-free.

Figure 5:
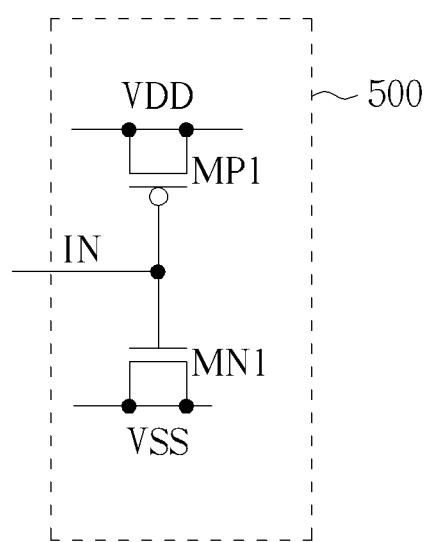
FIG. 5 is a diagram illustrating a first MOS capacitor based timing fixing circuit according to an embodiment of the present invention.

In some embodiments of the present invention, each of the capacitors $C_1$-$C_N$ may be realized by a metal oxide semiconductor (MOS) capacitor. FIG. 5 is a diagram illustrating a first MOS capacitor based timing fixing circuit according to an embodiment of the present invention. The timing fixing circuit 402 shown in FIG. 4 may be implemented by the timing fixing circuit 500 shown in FIG. 5. As shown in FIG. 5, the timing fixing circuit 500 includes a PMOS transistor MP1 and an NMOS transistor MN1. Regarding the PMOS transistor MP1 that is used to act as one MOS capacitor, a control terminal (e.g., gate) is coupled to the input pin IN of the timing fixing circuit 500, a first connection terminal (e.g., source) is coupled to a power rail VDD, and a second connection terminal (e.g., drain) is also coupled to the power rail VDD. Regarding the NMOS transistor MN1 that is used to act as another MOS capacitor, a control terminal (e.g., gate) is coupled to the input pin IN of the timing fixing circuit 500, a first connection terminal (e.g., source) is coupled to a power rail VSS, and a second connection terminal (e.g., drain) is also coupled to the power rail VSS. The power rail VDD is used to deliver a supply voltage (e.g., 3.3V or 5V), and the other power rail VSS is used to deliver a ground voltage (e.g., 0V). In contrast to the inverter 208 that has an output pin OUT', the timing fixing circuit 500 has no output pin.

Figure 6:
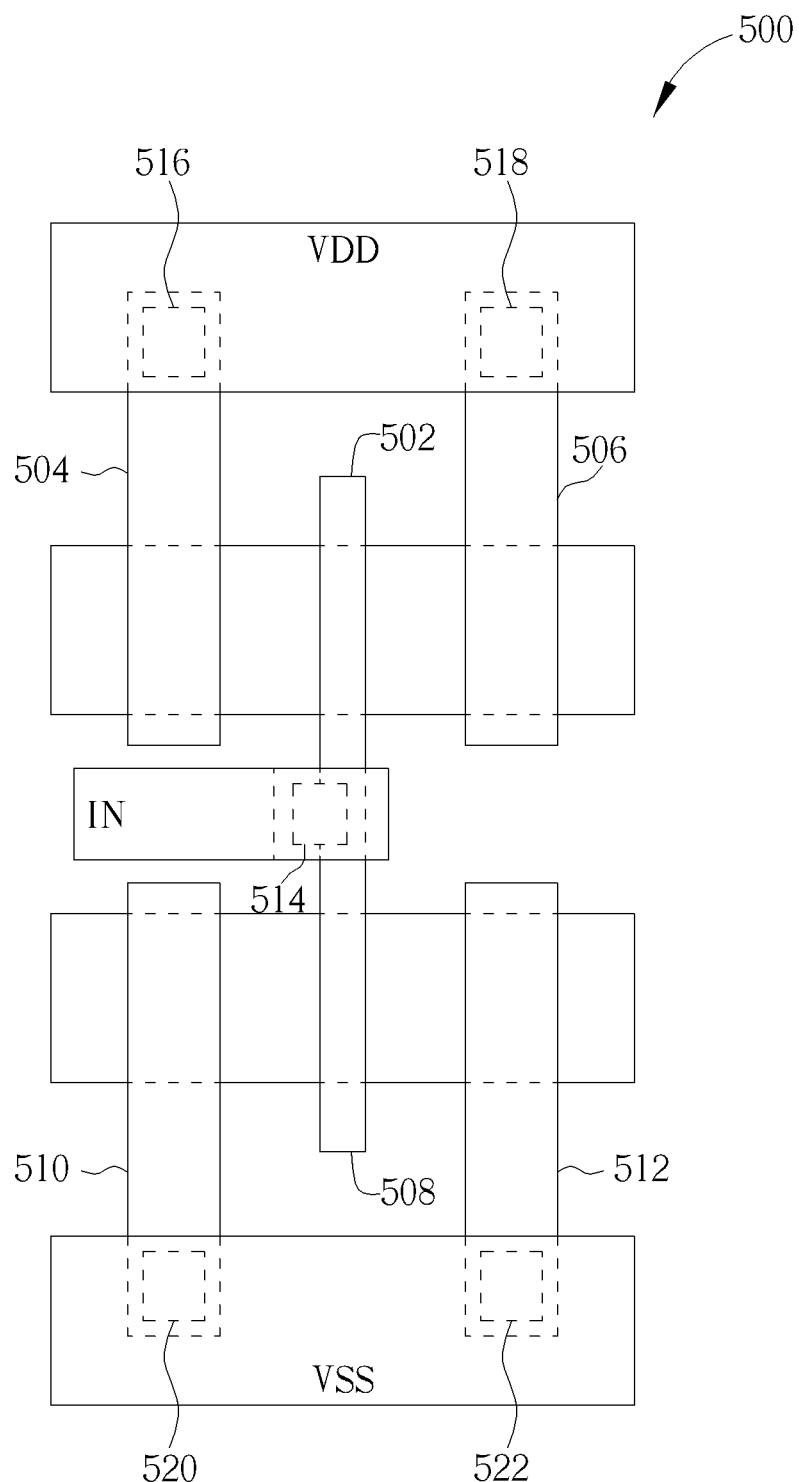
FIG. 6 is a diagram illustrating an exemplary layout of the timing fixing circuit shown in FIG. 5.

FIG. 6 is a diagram illustrating an exemplary layout of the timing fixing circuit 500 shown in FIG. 5. The input pin IN and the power rails VDD and VSS are on a metal layer. The source 504 and drain 506 of the PMOS transistor MP1 and the source 510 and drain 512 of the NMOS transistor MN1 are on a metal diffusion (MD) layer. Regarding the PMOS transistor MP1, the poly gate 502 is connected to the input pin IN at via 514, the source 504 is connected to the power rail VDD at via 516, and the drain 506 is connected to the power rail VDD at via 518. Regarding the NMOS transistor MN1, the poly gate 508 is connected to the input pin IN at via 514, the source 510 is connected to the power rail VSS at via 520, and the drain 512 is connected to the power rail VSS at via 522. As shown in FIG. 6, drain 506 of the PMOS transistor MP1 and drain 512 of the NMOS transistor MN1 are not connected to each other, and thus there is no output pin in the timing fixing circuit 500.

Figure 7:
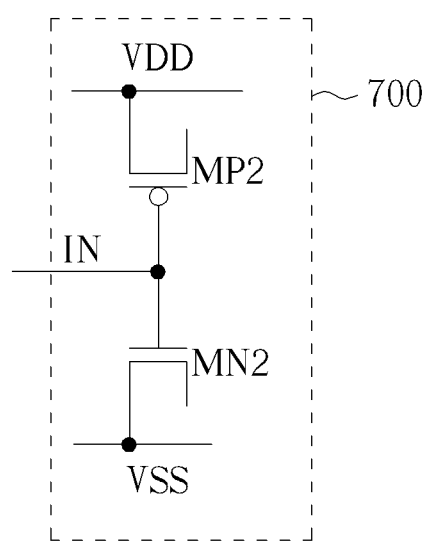
FIG. 7 is a diagram illustrating a second MOS capacitor based timing fixing circuit according to an embodiment of the present invention.

FIG. 7 is a diagram illustrating a second MOS capacitor based timing fixing circuit according to an embodiment of the present invention. The timing fixing circuit 402 shown in FIG. 4 may be implemented by the timing fixing circuit 700 shown in FIG. 7. As shown in FIG. 7, the timing fixing circuit 700 includes a PMOS transistor MP2 and an NMOS transistor MN2. Regarding the PMOS transistor MP2 that is used to act as one MOS capacitor, a control terminal (e.g., gate) is coupled to the input pin IN of the timing fixing circuit 700, a first connection terminal (e.g., source) is coupled to a power rail VDD, and a second connection terminal (e.g., drain) is floating. Regarding the NMOS transistor MN2 that is used to act as another MOS capacitor, a control terminal (e.g., gate) is coupled to the input pin IN of the timing fixing circuit 700, a first connection terminal (e.g., source) is coupled to a power rail VSS, and a second connection terminal (e.g., drain) is floating. The power rail VDD is used to deliver a supply voltage (e.g., 3.3V or 5V), and the other power rail VSS is used to deliver a ground voltage (e.g., 0V). In contrast to the inverter 208 that has an output pin OUT', the timing fixing circuit 700 has no output pin.

Figure 8:
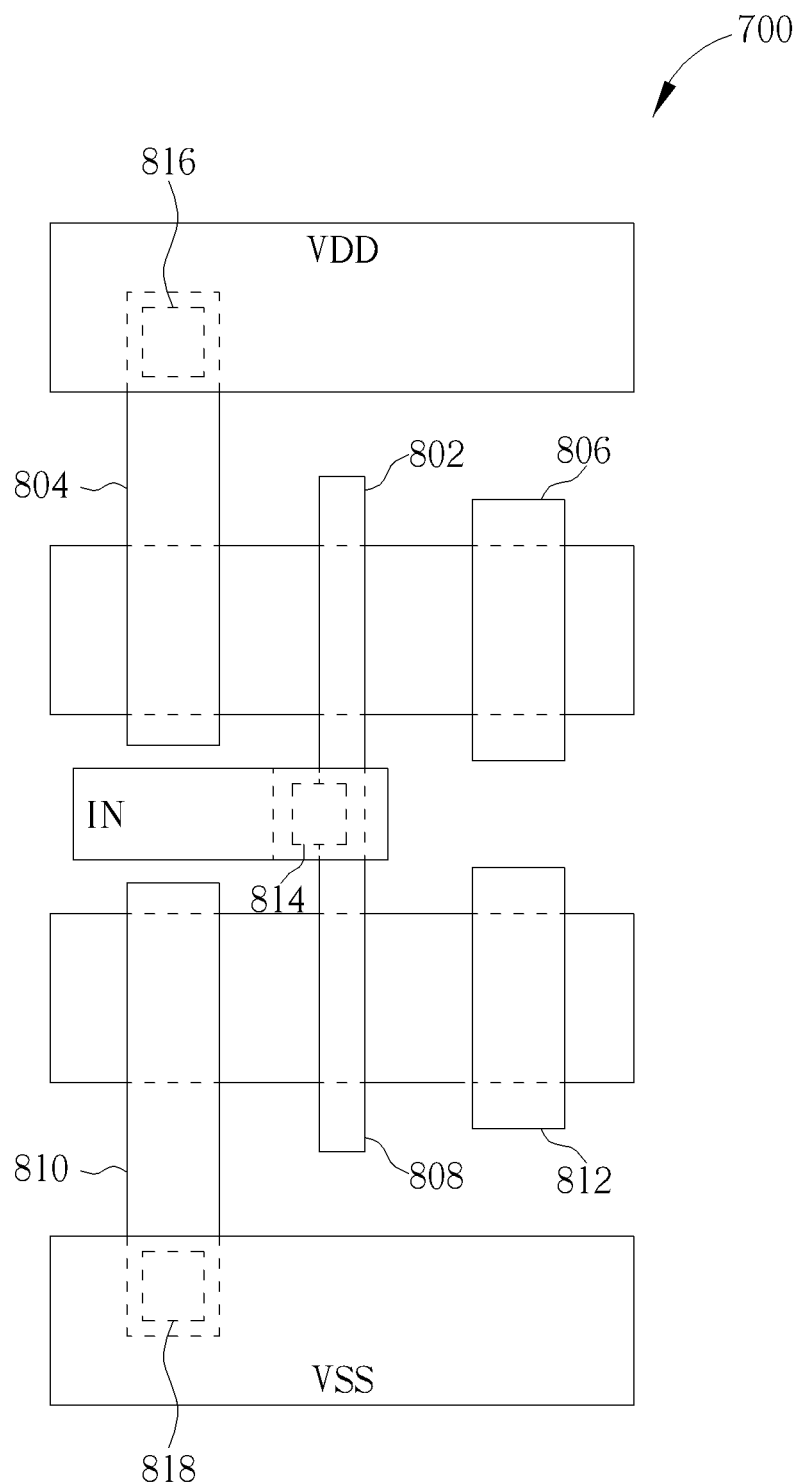
FIG. 8 is a diagram illustrating an exemplary layout of the timing fixing circuit shown in FIG. 7.

FIG. 8 is a diagram illustrating an exemplary layout of the timing fixing circuit 700 shown in FIG. 7. The input pin IN and the power rails VDD and VSS are on a metal layer. The source 804 and drain 806 of the PMOS transistor MP2 and the source 810 and drain 812 of the NMOS transistor MN2 are on a metal diffusion (MD) layer. Regarding the PMOS transistor MP2, the poly gate 802 is connected to the input pin IN at via 814, the source 804 is connected to the power rail VDD at via 816, and the drain 806 is floating. Regarding the NMOS transistor MN2, the poly gate 808 is connected to the input pin IN at via 814, the source 810 is connected to the power rail VSS at via 818, and the drain 812 is floating. As shown in FIG. 8, drain 806 of the PMOS transistor MP2 and drain 812 of the NMOS transistor MN2 are not connected to each other, and thus there is no output pin in the timing fixing circuit 700.

Figure 9:
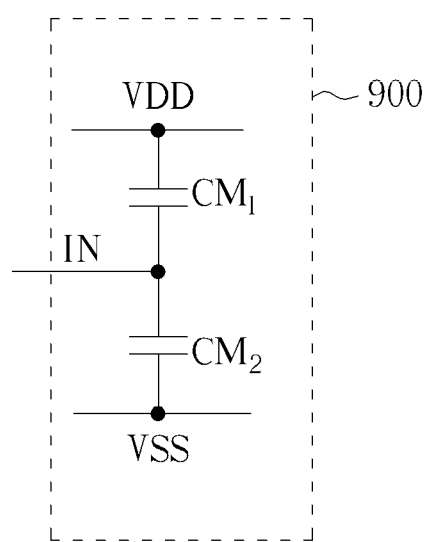
FIG. 9 is a diagram illustrating a first metal-layer capacitor based timing fixing circuit according to an embodiment of the present invention.

In some embodiments of the present invention, each of the capacitors $C_1$-$C_N$ may be realized by a metal-layer capacitor. FIG. 9 is a diagram illustrating a first metal-layer capacitor based timing fixing circuit according to an embodiment of the present invention. The timing fixing circuit 402 shown in FIG. 4 may be implemented by the timing fixing circuit 900 shown in FIG. 9. As shown in FIG. 9, the timing fixing circuit 900 includes two metal-layer capacitors $CM_1$ and $CM_2$. The metal-layer capacitor $CM_1$ has one plate coupled to a power rail VDD and the other plate coupled to the input pin IN of the timing fixing circuit 900. The metal-layer capacitor $CM_2$ has one plate coupled to a power rail VSS and the other plate coupled to the input pin IN of the timing fixing circuit 900. The power rail VDD is used to deliver a supply voltage (e.g., 3.3V or 5V), and the other power rail VSS is used to deliver a ground voltage (e.g., 0V). In contrast to the inverter 208 that has an output pin OUT', the timing fixing circuit 900 has no output pin.

Figure 10:
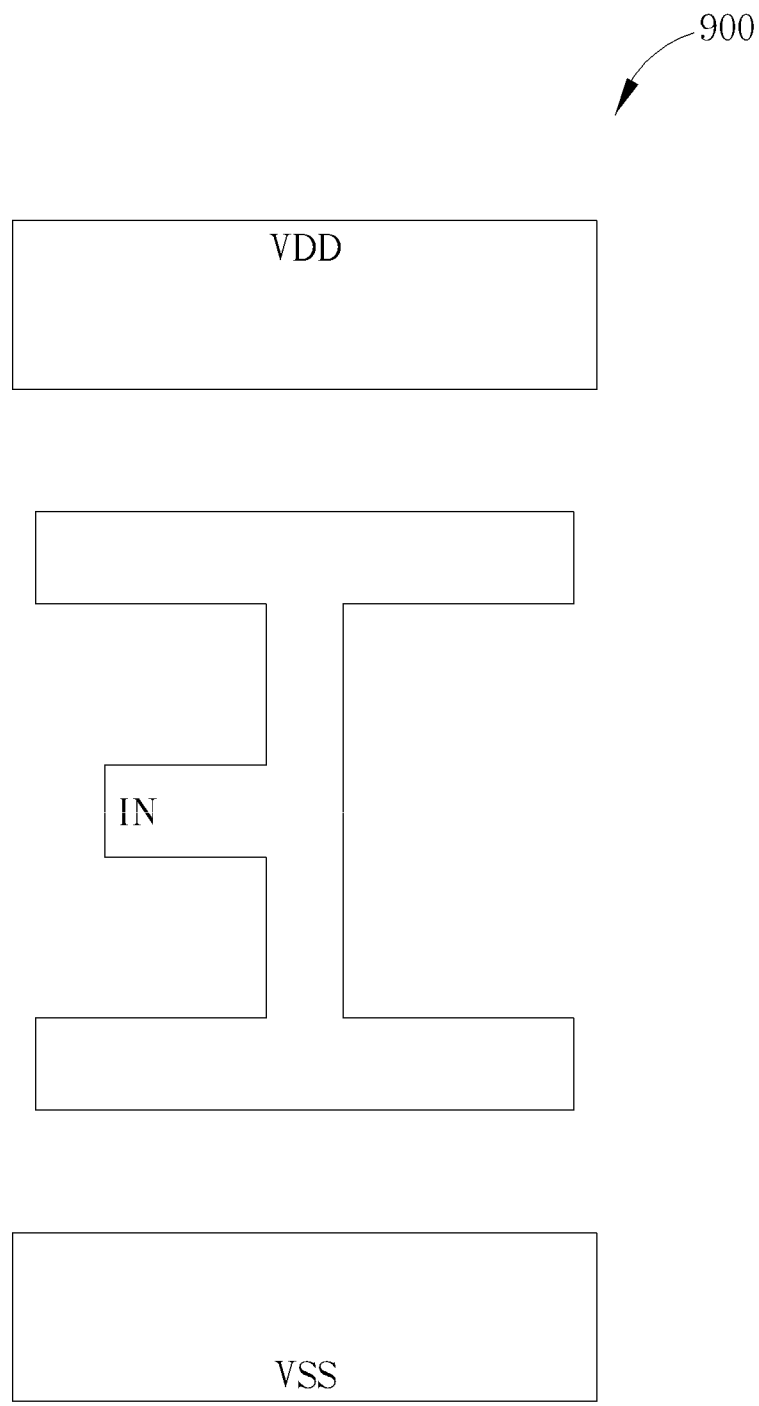
FIG. 10 is a diagram illustrating an exemplary layout of the timing fixing circuit shown in FIG. 9.

FIG. 10 is a diagram illustrating an exemplary layout of the timing fixing circuit 900 shown in FIG. 9. The input pin IN and the power rails VDD and VSS are on a metal layer. The metal-layer capacitor $CM_1$ exists between a metal-layer region associated with the power rail VDD and a metal-layer region associated with the input pin IN. The metal-layer capacitor $CM_2$ exists between a metal-layer region associated with the power rail VSS and a metal-layer region associated with the input pin IN.

Figure 11:
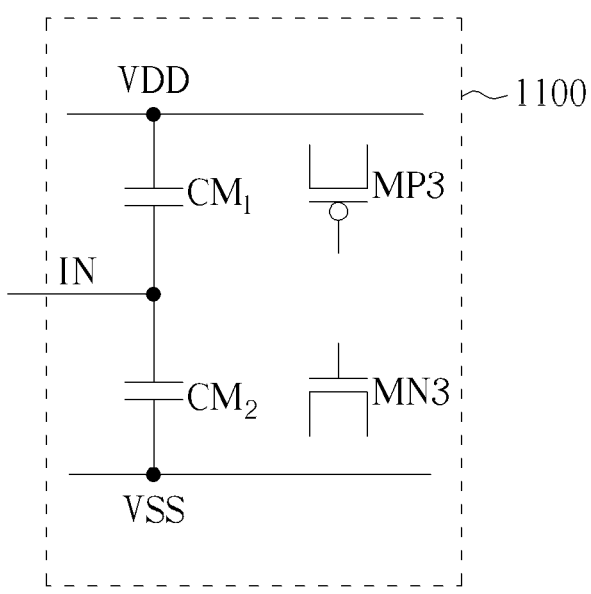
FIG. 11 is a diagram illustrating a second metal-layer capacitor based timing fixing circuit according to an embodiment of the present invention.

To achieve uniformity of the semiconductor process, a metal-layer capacitor may be accompanied with a dummy MOS transistor. FIG. 11 is a diagram illustrating a second metal-layer capacitor based timing fixing circuit according to an embodiment of the present invention. The timing fixing circuit 402 shown in FIG. 4 may be implemented by the timing fixing circuit 1100 shown in FIG. 11. The major difference between the timing fixing circuits 900 and 1100 is that the timing fixing circuit 1100 further includes a dummy PMOS transistor MP3 and a dummy NMOS transistor NM3, where the dummy PMOS transistor MP3 includes a floating control terminal (e.g., floating gate) and two floating connection terminals (e.g., floating source and floating drain), and the dummy NMOS transistor MN3 includes a floating control terminal (e.g., floating gate) and two floating connection terminals (e.g., floating source and floating drain). In contrast to the inverter 208 that has an output pin OUT', the timing fixing circuit 1100 has no output pin.

Figure 12:
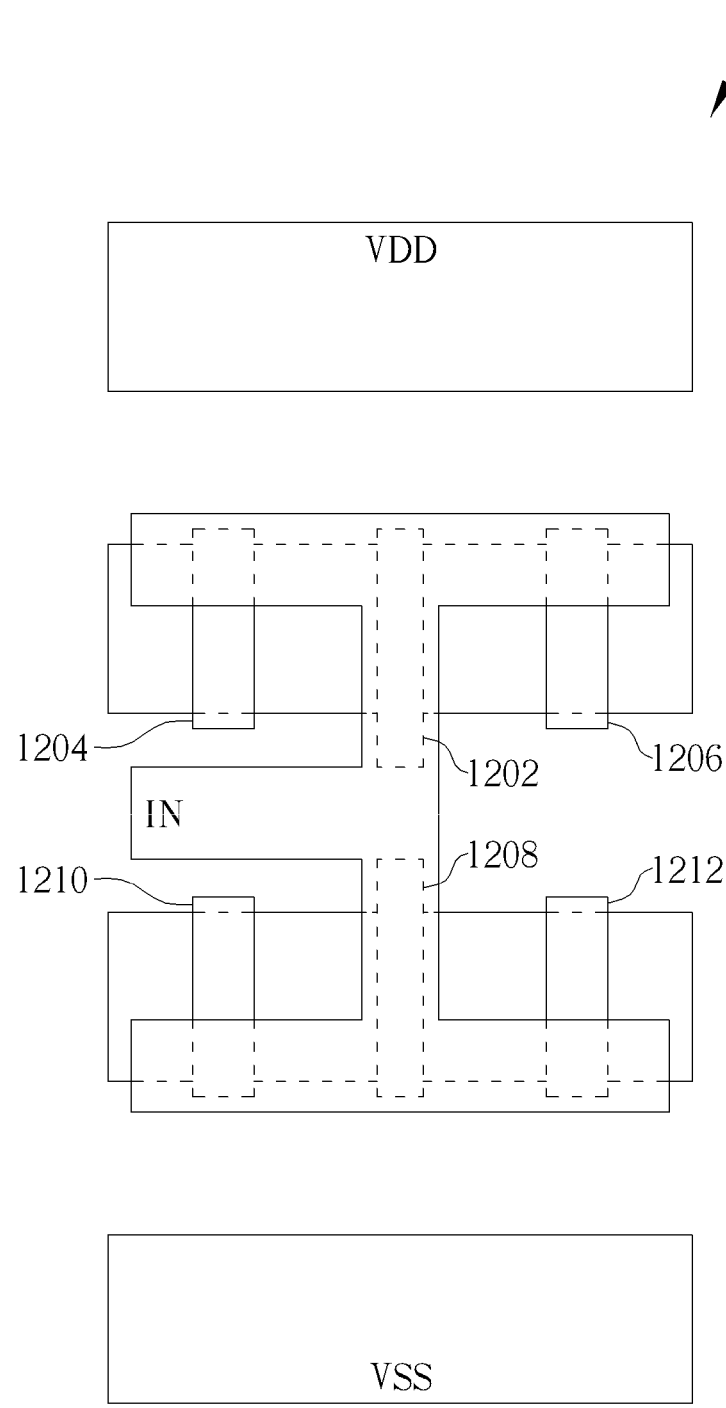
FIG. 12 is a diagram illustrating an exemplary layout of the timing fixing circuit shown in FIG. 11.

FIG. 12 is a diagram illustrating an exemplary layout of the timing fixing circuit 1100 shown in FIG. 11. The input pin IN and the power rails VDD and VSS are on a metal layer. The metal-layer capacitor $CM_1$ exists between a metal-layer region associated with the power rail VDD and a metal-layer region associated with the input pin IN. The metal-layer capacitor CM₂ exists between a metal-layer region associated with the power rail VSS and a metal-layer region associated with the input pin IN. The source 1204 and drain 1206 of the dummy PMOS transistor MP3 and the source 1210 and drain 1212 of the dummy NMOS transistor MN3 are on a metal diffusion (MD) layer. Regarding the dummy PMOS transistor MP3, the poly gate 1202, the source 1204, and the drain 1206 are all floating. Regarding the dummy NMOS transistor MN3, the poly gate 1208, the source 1210, and the drain 1212 are all floating.

The integrated circuit 100 is fabricated according to an integrated circuit layout design. The proposed timing fixing circuit 402 with no short-circuit current under normal operation can be defined by a proposed timing fixing cell. The proposed timing fixing cell can be imported into an existing cell library. In general, engineering change order (ECO) cells have a wide variety of implementations that range from adding or removing logic in a design to more subtle changes such as cleaning up routing for signal integrity. The proposed timing fixing cell may be an IR-free ECO cell in a cell library. Hence, the proposed IR-free ECO cell can be compatible with an existing digital design flow for cell sizing/swapping.

Figure 13:
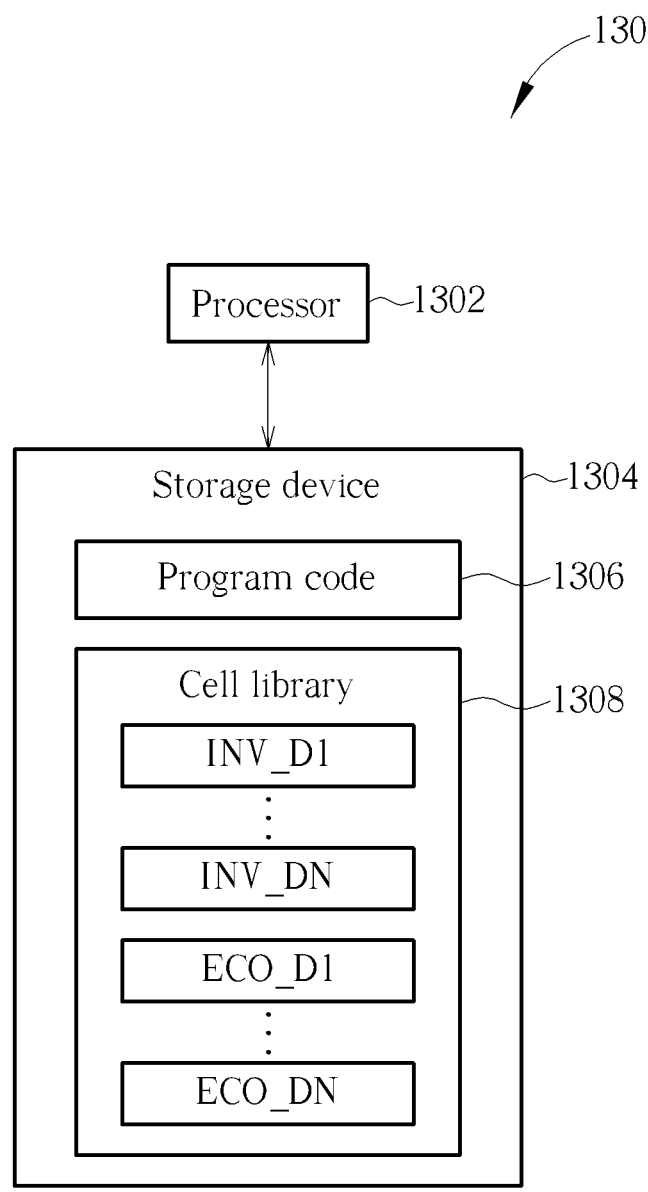
FIG. 13 is a diagram illustrating an electronic apparatus used for running a digital design flow according to an embodiment of the present invention.

FIG. 13 is a diagram illustrating an electronic apparatus used for running a digital design flow according to an embodiment of the present invention. The electronic apparatus 1300 includes a processor 1302 and a storage device 1304. For example, the storage device 1304 may be a hard disk, a non-volatile memory, or a volatile memory. The storage device 1304 stores a program code 1306 and a cell library 1308. When loaded and executed by the processor 1302, the program code 1306 instructs the processor 1302 to run a digital design flow for utilizing the cell library 1308 to create a new integrated circuit layout design or modify an existing integrated circuit layout design. The cell library 1308 may provide a huge number of cells. For example, the cell library 1308 may include inverter cells with different sizing INV_D1-INV_DN, and further includes a plurality of proposed IR-free ECO cells with different sizing ECO_D1-ECO_DN. The inverter cell INV_Di and the proposed IR-free ECO cell ECO_Di have the same cell size, where 1≤i≤N. For example, the inverter cells INV_D1-INV_DN may have the same cell height H but different cell widths W1-WN, and the IR-free ECO cells ECO_D1-ECO_DN may have the same cell height H but different cell widths W1-WN. Each of the inverter cell INV_D1-INV_DN is a representation of an inverter which receives an input from a preceding circuit and generates an output to a following circuit, and may be re-used as a representation of a timing fixing circuit that introduces short-circuit current under normal operation (e.g., inverter 208). Each of the IR-free ECO cell ECO_D1-ECO_DN is a representation of a timing fixing circuit that introduces no short-circuit current under normal operation (e.g., timing fixing circuit 402/500/700/900/1100). When the program code 1306 running on the processor 1320 receives a cell swapping command from a user input, the processor 1302 executes the cell swapping command to replace first-type timing fixing cell(s) in an integrated circuit layout design with second-type timing fixing cell(s), where each first-type timing fixing cell is one of the inverter cell INV_D1-INV_DN, and each second-type timing fixing cell is one of the IR-free ECO cell ECO_D1-ECO_DN. For example, the processor 1302 performs cell swapping upon an integrated circuit layout design to replace each inverter cell INV_D1 (which acts as a timing fixing cell) with the IR-free ECO cell ECO_D1, replace each inverter cell INV_D2 (which acts as a timing fixing cell) with the IR-free ECO cell ECO_D2, and so on. Since the proposed IR-free ECO cell is compatible with an existing digital design flow for cell sizing/swapping, an integrated circuit layout design can be easily modified by replacing a timing fixing cell (which defines a timing fixing circuit that introduces short-circuit current under normal operation, such as the inverter 208) with a proposed IR-free ECO cell (which defines a timing fixing circuit that introduces no short-circuit current under normal operation, such as the timing fixing circuit 402/500/700/900/1100).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit comprising:
 a path logic, coupled between an output pin of a first circuit and an input pin of a second circuit; and
 a timing fixing circuit, having an input pin coupled to the path logic and arranged to adjust a propagation delay of the path logic, wherein the timing fixing circuit introduces no short-circuit current under normal operation;
 wherein the timing fixing circuit comprises:
 a metal-layer capacitor, having a first plate and a second plate, wherein the input pin of the timing fixing circuit is coupled to the first plate of the metal-layer capacitor, and the second plate of the metal-layer capacitor is coupled to one power rail; and
 a dummy metal oxide semiconductor (MOS) transistor, having a floating control terminal and two floating connection terminals, wherein the metal-layer capacitor is accompanied with the dummy MOS transistor.

2. The integrated circuit of claim 1, wherein the timing fixing circuit has no output pin.

3. The integrated circuit of claim 1, wherein the timing fixing circuit comprises a first capacitor and a second capacitor, the metal-layer capacitor is one of the first capacitor and the second capacitor, the input node of the timing fixing circuit is coupled to a first plate of the first capacitor and a first plate of the second capacitor, a second plate of the first capacitor is coupled to a first power rail, a second plate of the second capacitor is coupled to a second power rail, and the first power rail and the second power rail are arranged to deliver different reference voltages.

4. The integrated circuit of claim 1, wherein each of the first circuit and the second circuit is a flip-flop, and the path logic is a data path logic.

5. An integrated circuit comprising:
 a path logic, coupled between an output pin of a first circuit and an input pin of a second circuit; and
 a timing fixing circuit, having an input pin coupled to the path logic and arranged to adjust a propagation delay of the path logic, wherein the timing fixing circuit introduces no short-circuit current under normal operation;
 wherein the timing fixing circuit comprises:
 at least one capacitor, each having a first plate and a second plate, wherein the input pin of the timing fixing circuit is coupled to the first plate of said at least one capacitor, and the second plate of said at least one capacitor is coupled to one power rail; and
 wherein said at least one capacitor is a metal oxide semiconductor (MOS) capacitor,
 comprising:
 a MOS transistor, having a control terminal, a first connection terminal, and a second connection terminal, wherein the gate terminal is coupled to the input pin of the timing fixing circuit, the first connection terminal is coupled to said one power rail, and the second connection terminal is floating.

6. A non-transitory storage device that stores a program code, wherein when loaded and executed by a processor, the program code instructs the processor to perform following steps:
   utilizing a cell library that comprises a first timing fixing cell and a second timing fixing cell, wherein the first timing fixing cell is a representation of a first timing fixing circuit that introduces short-circuit current under normal operation, and the second timing fixing cell is a representation of a second timing fixing circuit that introduces no short-circuit current under normal operation; and
   executing a cell swapping command to replace at least one first timing fixing cell in an integrated circuit layout design with at least one second timing fixing cell.

7. The non-transitory storage device of claim 6, wherein the first timing fixing cell has an input pin and an output pin, and the second timing fixing cell has an input pin but no output pin.

8. The non-transitory storage device of claim 6, wherein the second timing fixing cell is an engineering change order (ECO) cell.

9. The non-transitory storage device of claim 6, wherein the second timing fixing cell defines that the second timing fixing circuit comprises:
   at least one capacitor, each having a first plate and a second plate, wherein an input pin of the second timing fixing circuit is coupled to the first plate of said at least one capacitor, and the second plate of said at least one capacitor is coupled to one power rail.

10. The non-transitory storage device of claim 6, wherein the cell library further comprises a third timing fixing cell and a fourth timing fixing cell, the third timing fixing cell is a representation of a third timing fixing circuit that introduces short-circuit current under normal operation, the fourth timing fixing cell is a representation of a fourth timing fixing circuit that introduces no short-circuit current under normal operation, one of the first timing fixing cell and the third timing fixing cell has a first cell size, another of the first timing fixing cell and the third timing fixing cell has a second cell size, one of the second timing fixing cell and the fourth timing fixing cell has the first cell size, another of the second timing fixing cell and the fourth timing fixing cell has the second cell size, and the first timing fixing cell and the second timing fixing cell have a same cell size.

\* \* \* \* \*